(12) United States Patent
Powell

(10) Patent No.: US 6,645,357 B2
(45) Date of Patent: Nov. 11, 2003

(54) MESH SHIELD IN A SPUTTER REACTOR

(75) Inventor: Earl G. Powell, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 19 days.

(21) Appl. No.: 10/015,200

(22) Filed: Nov. 5, 2001

(65) Prior Publication Data

US 2003/0085121 A1 May 8, 2003

(51) Int. Cl.[7] .............................. C23C 14/00
(52) U.S. Cl. ................................... 204/298.11
(58) Field of Search ......................... 204/298.11

(56) References Cited

U.S. PATENT DOCUMENTS

| | | | |
|---|---|---|---|
| 5,614,071 A | 3/1997 | Mahvan et al. | 204/298.11 |
| 5,837,057 A | 11/1998 | Koyama et al. | 118/723 VE |
| 6,059,938 A | 5/2000 | Visser | 204/192.12 |
| 6,296,747 B1 | 10/2001 | Tanaka | 204/298.07 |
| 6,475,353 B1 * | 11/2002 | Lantsman | 204/192.12 |

* cited by examiner

*Primary Examiner*—Steven H. VerSteeg
(74) *Attorney, Agent, or Firm*—Charles S. Guenzer

(57) ABSTRACT

A sputtering shield for use in a plasma sputter reactor and formed of one or more layers of mesh bent into a desired shield shape is disclosed. The multiple layers are arranged to minimize overlap of mesh apertures to thereby decrease line-of-sight holes through the mesh assembly. A foil may be placed between the outermost two mesh layers to further increase opacity. The mesh may be fixed to solid metal parts, such as flanges, grommets, hemming, or complex parts of the overall shield. The mesh shield provides better adhesion of sputter coated layers, thereby allowing longer use before replacement, and is less expensive to fabricate so that it can be treated as a consumable.

16 Claims, 4 Drawing Sheets

MESH SHIELD IN A SPUTTER REACTOR

BACKGROUND OF THE INVENTION

1. Field of the Invention

The invention relates generally to sputter deposition of materials. In particular, the invention relates to a shield used in a sputter reactor.

2. Background Art

Sputtering, alternatively called physical vapor deposition (PVD), is the most prevalent method of depositing layers of metals and metal nitrides in the fabrication of silicon integrated circuits. Recently developed technology has enabled sputtering to be applied to many difficult structures, such as depositing thin barrier layers in high aspect-ratio holes.

In U.S. Pat. No. 6,296,747, Tanaka describes one such advanced plasma sputter reactor 10, illustrated schematically in the cross-sectional view of FIG. 1. The reactor 10 includes an aluminum reactor body 12 defining a vacuum chamber. A metal target 14 is supported on the wall 12 through an isolator 16 and faces a wafer 18 to be sputter coated. A wafer clamp 20 holds the wafer 18 on a pedestal electrode 22. A vacuum pump system 26 connected to the chamber through a pumping port 28 is capable of maintaining the interior of the chamber at a very low pressure of down to about $10^{-8}$ Torr. However, a sputter working gas, such as argon is supplied from a gas source 30 and metered by a mass flow controller 32 to flow through an inlet 34 into the chamber at a pressure typically in the low milliTorr range. When a DC power supply 36 applies a negative voltage of about −600 VDC to the metal target 14, the argon working gas is excited into a plasma and the positively charged argon ions are attracted to the target 14 at high energy and sputter metal atoms from the target 14. Some of these metal ions strike the wafer 18 and are deposited in a thin layer thereon.

The reactor 10 is configured for self-ionized plasma (SIP) sputtering. A small magnetron 40 is positioned at the back of the target 14 and includes an inner magnetic pole 42 of one magnetic polarity surrounded by an outer magnetic pole 44 of the opposite polarity and of a substantially greater total magnetic intensity. The poles 42, 44 are supported on and magnetically coupled by a magnetic yoke 46, which is itself supported on a motor driven shaft 48 positioned along a center axis 50 of the chamber so that the magnetron 40 is rotated about the center axis. The magnetron 40 creates a magnetic field adjacent the interior face of the target 14 and thereby creates a region of high-density plasma next to the target 14, which intensifies the sputtering rate in the portion of the target 14 adjacent the high-density plasma. The magnetron rotation produces a more uniform sputtering pattern.

The sputtering process not only coats the wafer 18 with the sputtered metal atoms, it also coats any other body exposed to the target 14, such as the chamber wall 12. Cleaning sputtered material from the interior of the chamber wall 12 is difficult and time consuming. Accordingly, it is standard practice to include sputter shields, such as the illustrated upper and lower shields 54, 56, typically formed of aluminum or stainless steel, which protect the chamber wall 12 from sputter deposition and are instead themselves coated with the sputtered material. A topmost shield 58 protects the isolator and is positioned close to the target 14 to form a plasma dark space between it and target 14. When the shields 54, 56, 58 become excessively coated to the point that the coating tends to flake and produce deleterious particles, they are replaced with fresh shields in a preventative maintenance (PM) procedure. At least the lower shield 54 is usually electrically grounded to act as the anode in opposition to the target cathode in the plasma generation process.

In SIP sputtering, the magnetic field and the target power are increased to the extent that a large fraction of the sputtered metal atoms are ionized to produce two effects. First, the metal ions are themselves attracted back to the target to sputter yet further metal atoms in a process referred to as self-sputtering. As a result, the argon supply and chamber pressure can be decreased. In the case of copper sputtering, it is possible to stop the supply of argon once the plasma has been ignited. Secondly, the metal ions can be accelerated towards the wafer by an RF power supply 60 connected to the pedestal electrode 22, which results in a negative DC self bias on the wafer 18. A controller 62 controls the power supplies 36, 60 and the flow of gas to set the processing conditions. Further, the magnetic field created by the unbalanced intensities of the magnetic poles 42, 44 can guide the metal ions to the wafer 18.

Such ionized sputtering and controlled directionality is advantageous for sputtering material into deep and narrow holes, that is, holes having a high aspect-ratio. Aspect ratios of 5:1 are becoming common for inter-level electrical vias through silica-based dielectric layers, and aspect ratios are increasing for advanced products. As a result, sputtering can be used to deposit thin liner layers on the bottom and sidewalls of the via holes. One such liner layer is a barrier layer required to be interposed between the metal filled into the via and the silica dielectric to prevent the metal from diffusing into the silica and making it conductive. For aluminum metallization, a titanium-based barrier of Ti/TiN is typically used, where TiN is titanium nitride. For copper metallization, a tantalum-based barrier of Ta/TaN is more typical, although other barrier materials are possible. The titanium or tantalum is usually deposited first to act as a glue layer to the underlying silica while the nitride acts as the actual barrier material.

Sputtering, particularly ionized sputtering, can be used to deposit both the metal portion and the metal nitride portion of the barrier. The target 14 has at least its front surface composed of the metal, whether it be titanium, tantalum, or other barrier metals such as tungsten. In a first phase, called metal sputtering, a thin metal layer is deposited on the wafer 18 under biasing conditions that favor sidewall deposition. In a second phase, called reactive sputtering, nitrogen is additionally admitted into the chamber from a nitrogen source 66 through its mass flow controller 68. The nitrogen reacts with the metal atoms at or near the surface of the wafer to deposit a coating of metal nitride.

Reactive sputtering increases the problems associated with the sputtering shields. A first problem addressed by Tanaka is that nitrogen, unlike argon, is consumed in reactive sputtering. The gas inlet 34 is preferably located behind the shields 54, 56, and the gas flows into the main processing area through a gap 70 between the lower shield 56 the clamp 20, and the pedestal electrode 22. While this flow pattern is sufficient for argon, it constrains the supply of nitrogen and it is possible that the nitriding is incomplete. Accordingly, Tanaka forms a ring of perforations 74 in the lower shield 12 to facilitate the flow of nitrogen into the main processing region. However, to protect the chamber wall in back of the perforations, he additionally includes the upper shield 54 to cover the perforations 74 with a downwardly facing gap 76 between the two shields 54, 56 to flow the nitrogen from the perforations 74 into the main processing region. While the structure is effective, it is complicated.

Particulate flaking of shields in reactive sputtering is a particularly troublesome effect. Nitrides tend to be much harder and less pliable than metals Accordingly, they are more prone to flaking at lesser coating thicknesses. It has become typical to roughen the shield surface exposed to sputter coating. Machined grooves are disclosed by Koyama et al. in U.S. Pat. No. 5,837,057 and by Visser in U.S. Pat. No. 6,059,938. A more commercially popular approach is to form the shield of stainless steel and to coat the areas of the shield exposed to sputter coating with an aluminum layer applied by arc spraying. The so applied aluminum is very rough and improves the anchorage of the nitride film to the shield. Another technique, called pasting, involves the periodic sputter deposition of a relatively thick layer of the more pliable metal over the coated shield to paste the flake-prone nitride to the shield. Pasting is somewhat effective, but it interrupts the production scheduling.

Even with these techniques, shields used in reactive sputtering tend to begin flaking after a number of wafer cycles typical of the process. Accordingly, it is standard practice to replace the shields after a set number of wafer cycles in a preventative maintenance process. A typical number of wafer cycles between shield replacements is about 5000 wafers. This number compares to about 20,000 wafers for a barrier target after which the target needs to be replaced. The additional preventative maintenance steps required for shield replacement significantly reduce the throughput of expensive sputtering equipment. It is greatly desired to increase the number of wafer cycles before a shield needs to be replaced, preferably a number at least equal to the life of the target.

The roughened shields described above also tend to be relatively expensive. Accordingly, it is typical to refurbish a coated shield and again use it. For example, the nitride coating is stripped, for example, by removing the arc-sprayed aluminum then again arc spraying aluminum onto the affected areas. Refurbishment is typically done in speciality shops separate from the fab line and introduces logistical problems in shipping and control of used parts. It is thus desired to provide a shield that is inexpensive enough and has a long enough lifetime that it can be treated as a consumable, throw-away item without the need to be refurbished.

SUMMARY OF THE INVENTION

A shield used to protect chamber walls and other parts in a sputter reactor is composed of at least one layer of mesh. The mesh includes apertures having sizes in the range of 1 to 6 mm and a porosity range of 10 to 95%. Preferably, the mesh may have a regular two-dimensional pattern of apertures.

Multiple layers of mesh are laminated together. The meshes of the different layers may be of different grades, preferably with the mesh layer farthest from the chamber interior having the finest mesh. A foil may be interposed between two mesh layers, preferably the two farthest layers. If needed, the foil may be perforated to increase the gas flow through the mesh assembly.

The one or more mesh layers can be bent to a desired shape. Metallic hemming may be crimped or otherwise attached to the exposed ends. Holes may be cut in the mesh assembly and may be optionally lined with a grommet or similar circumferential cover.

The mesh may be formed, for example, of expanded metal mesh, woven wire, or crushed honeycomb.

DETAILED DESCRIPTION OF THE PREFERRED EMBODIMENTS

A sputtering shield can be advantageously formed at least in part by one or more layers of mesh. One type of mesh 80 illustrated in plan view in FIG. 2 contains a repetitive pattern of diamond-shaped apertures 82 separated by webs 84 extending in two dimensions in an integral matrix. The diamond-shaped apertures 82 may be square or other shape, but more preferably each aperture 82 is shaped as a rhombus with the webs 84 intersecting at non-perpendicular angles. This type of mesh is commercially available as an expanded metal mesh, which is formed by using a die to perforate a thin metal sheet or foil having, for example, a thickness in the range of 0.2 to 1 mm. The perforated sheet is then stretched along one axis, preferably perpendicular to the axis of the thin perforations, so that the sheet is elongated along the stretched axis and compressed along the perpendicular axis. The resultant expanded metal mesh has generally planar principle surfaces at the top and bottom of the illustrated thin mesh and apertures extending through the mesh with substantially vertical sidewalls. An expanded metal mesh may be formed of almost any type of metal. However, for purposes of a shield used in reactive nitride sputtering, an aluminum mesh is preferred. It is understood that the aluminum may include alloying elements up to about 10 wt %.

The size of the apertures 82, measured by a maximum transverse distance, may be adjusted according to use and the number of layers used in forming the shield. However, an aperture size in the range of 1 to 6 mm, measured as the average transverse dimension of the aperture, facilitates smooth bending on the scale of 200 to 300 mm wafers while minimizing the possibility of the apertures being plated over. The percentage of the area of the member formed as apertures, that is, other than the metal matrix, should be in the range of 10 to 95%. This percentage may be referred to as the porosity factor.

The mesh thickness and aperture size are subject to conditions of sputtering. In particular, a characteristic length may be determined as the maximum thickness of sputter deposited material before the deposited layer begins flaking. Shields need to be replaced preferably before this maximum thickness is reached. Further use of the thickened shield will result in very high levels of particulates. Experience with unperforated shields indicates that this thickness may be in the vicinity of 1 to 3 mm for the sputtering conditions being used. The minimum lateral dimension of the aperture needs to be greater than the characteristic thickness so that the build up does not bridge or unduly shadow the mesh apertures, thereby reducing their effectiveness. The total thickness of the layers of the mesh assembly should also be greater than the characteristic thickness so that there is a high likelihood that a sputtered particle hits the sides of the apertures one or more times, preferably three times.

Figure 2:
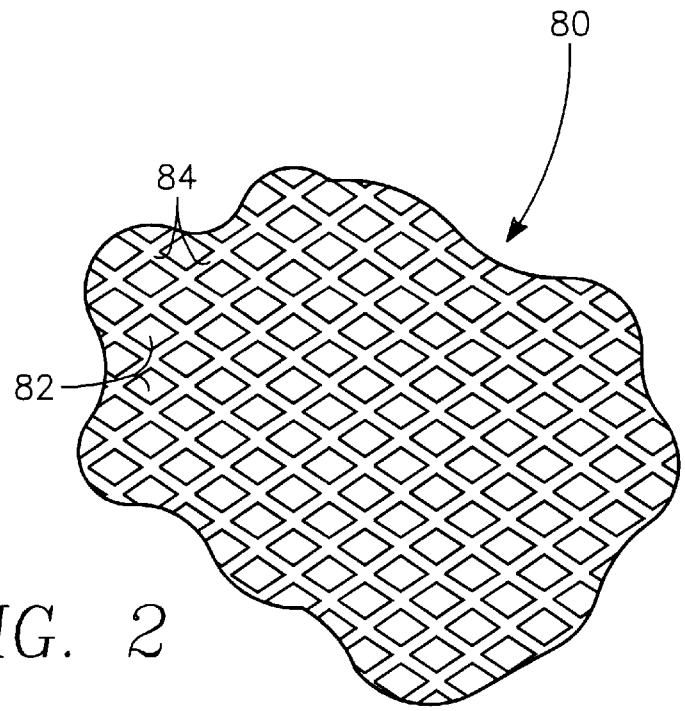
FIG. 2 is a plan view of an integral mesh usable in accordance with the invention.
Figure 3:
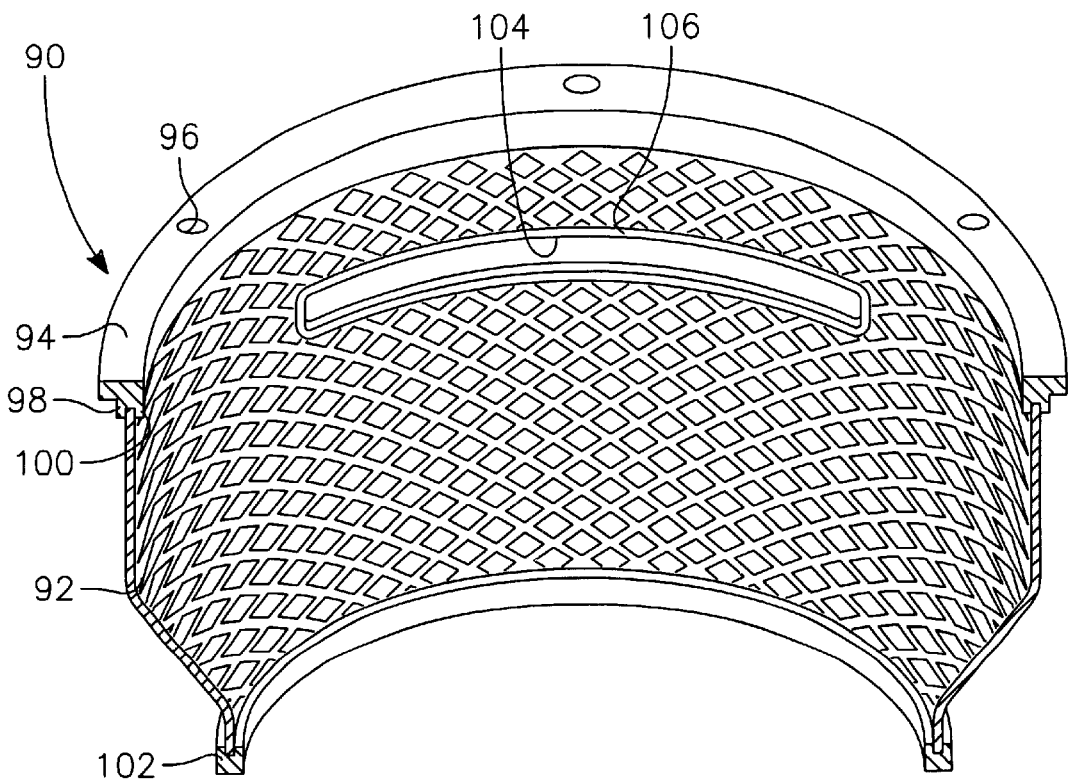
FIG. 3 is a partially sectioned orthographic view of a shield of one embodiment of the invention.

The partially sectioned orthographic view of FIG. 2 illustrates a shield 90 formed with a mesh part 92 that has been shaped to have axially arranged parts of two different diameters. Such shaping is easily performed with expanded metal mesh by pressing the mesh around a similarly shaped mandrel. The expanded metal mesh can be made of a relatively soft and pliant matrix to be easily bent and to hold its bent shape. Such metal mesh is often used in forming artistic shapes such as statues.

The mesh is most typically formed of a metal, such as aluminum, copper, or stainless steel. As a result, it can be electrically grounded, or biased to a fixed potential, or left electrically floating to develop its own potential as charged particles from the plasma deposit on it.

The shield 90 may also include several solid parts. An annular metal flange 94 formed as a solid member is drilled with through holes 96 to pass screws for fixing the shield 90 to the sputter chamber. The flange 94 includes two flexible fins 98, 100 to accept the top of the mesh part 92 and which are crimped to hold the mesh part 92 to the flange.

It is preferred that any jagged edges of the cut mesh not be exposed. Accordingly, the bottom of the mesh part 92 is crimped to an annular metal hemming 102. As an alternative to the crimping, the solid metal pieces may be brazed or welded to the mesh. However, it is considered unnecessary to cover the cut edges of an expanded metal mesh.

Holes may be cut into the mesh part 92, for example, a short wide slot 104 allowing a wafer to be inserted into the sputter chamber through the shield 90. The slot 104 is preferably lined with a grommet 106, which may be formed of two portions positioned inside and outside the mesh part 92 and then deformed against each other to capture the mesh part 92. Alternatively, a tool may bend the edges of a one-piece grommet 106 back against itself, trapping the mesh part 92. Circular grommets may be used as bases for screws fixing the mesh itself to a support structure.

Other solid metal parts may be combined with the mesh. For example, the trough portion of the lower shield 56 of FIG. 2 including the bottom wall 110 and the ascending wall 112 may be formed of solid metal crimped or brazed to a mesh descending wall 114.

Figure 4:
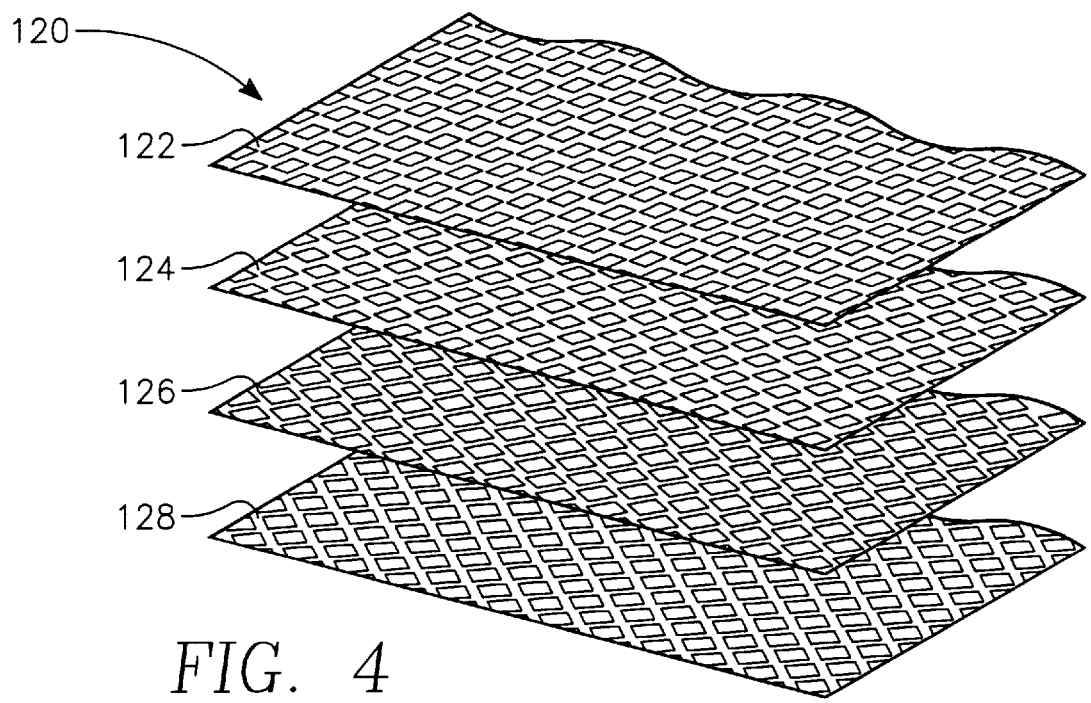
FIG. 4 is a schematic partially sectioned and exploded orthographic view of a multi-layer mesh laminate.

The mesh is preferably formed of multiple layers of mesh. As illustrated in the partially sectioned and exploded orthographic view of FIG. 4, a shield wall 120 includes four mesh layers 122, 124, 126, 128 sandwiched together. In the formed structure, the layers contact each other but need to held together only by an occasional fixing spot, such as a weld. Alternatively, the layers 122, 124, 126, 128 may be formed of a single sheet of mesh wrapped multiple times about a central axis. The number of layers may be more, for example, six or eight. In the process of conforming the planar mesh to a nested cylindrical form, the apertures of the different layers 122, 124, 126, 128 do not stay in registry so that there is very little possibility of a clear line of sight existing through all of the multiple layers. However, to further reduce the possibility of a straight, line-of-sight path through the shield 120, the mesh layers having rhombohedral (non-square) apertures may be oriented differently between the layers. Alternatively, different grades or types of meshes may be used with the aperture sizes or mesh pitch varied between the layers. In this variation, the aperture size of the layer 122 facing the processing region at the center of the sputter reactor should be larger than the aperture size of the outer layers. This gradation exposes the outer layers to greater sputter deposition, thus maximizing the effective area of the shield.

The multiple layers of mesh produces a sputtering shield that blocks virtually all sputtered particles from passing through it. Advantageously, it has a large number of edges separating the relatively narrow webs between the apertures. As a result, the sputter coated materials, particularly the nitrides which do not adhere well to aluminum, are better anchored to the aluminum mesh than to a smooth, unperforated aluminum member. Also, the multiple mesh layers result in a relatively large effective surface area producing a thinner coated layer, at least for the lower mesh layers.

Figure 1:
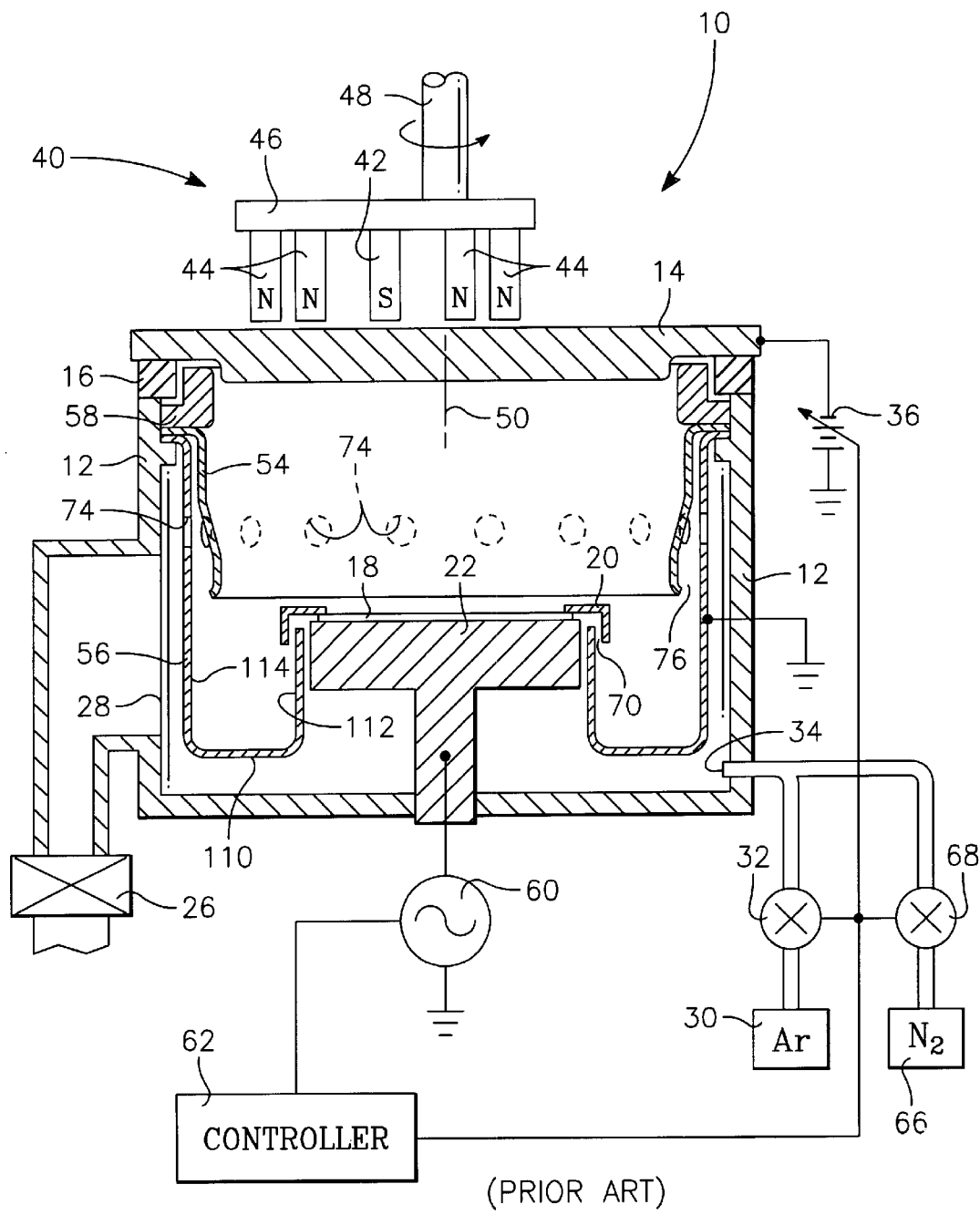
FIG. 1 is a cross sectional view of a plasma sputter reactor.
Figure 5:
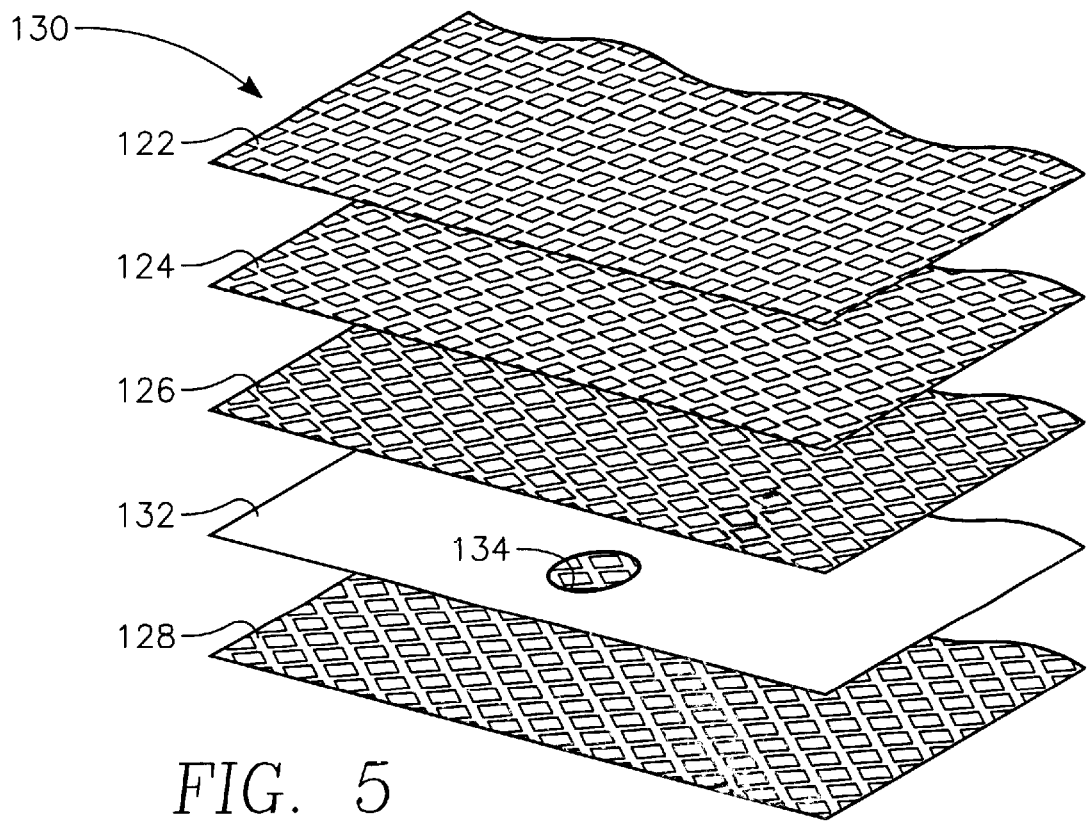
FIG. 5 is a view of a modification of the mesh laminate of FIG. 4.
Figure 6:
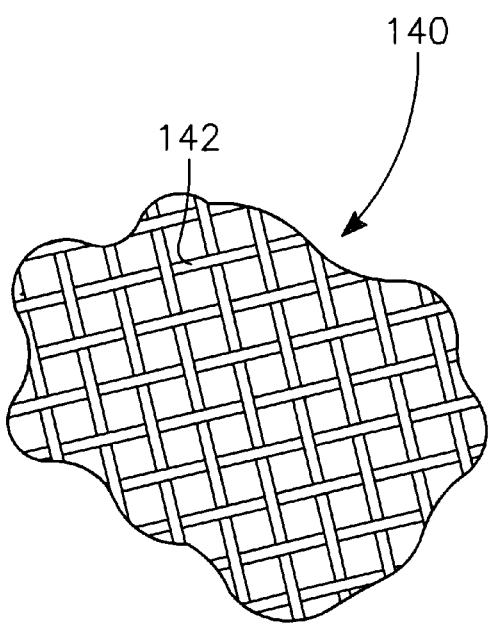
FIG. 6 is a plan view a woven mesh.
Figure 7:
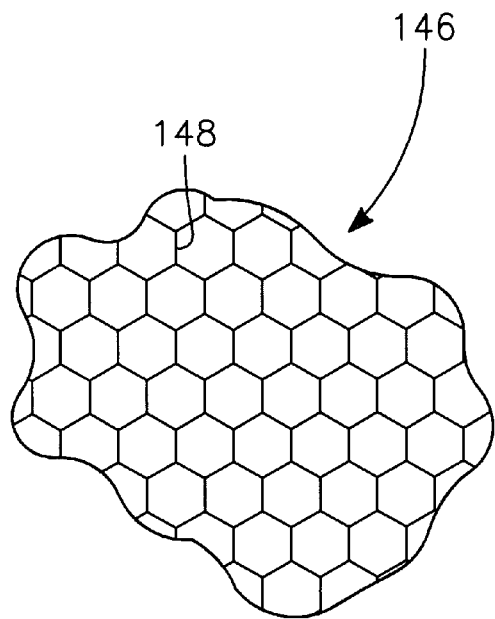
FIG. 7 is a plan view of a honeycomb mesh.

A shield wall 130, as illustrated in FIG. 5, with a more definite approach for creating an opaque shield, includes a solid metal foil 132 between two of the mesh layers, preferably between the two outermost mesh layers 126, 128, thus assuring no clear line of sight through the mesh shield while still using an inexpensive and easily shaped foil material. However, if additional gas flow through the shield is desired, the foil 132 may be formed with one or more holes 134, which operate similarly to the perforations 74 of FIG. 1.

The invention is not limited to a mesh of solid metal matrix formed with apertures. Other types of structures provide similar results. A woven mesh 140, illustrated in plan view in FIG. 5, consists of interlaced wires 142 and resembles a window screen. A honeycomb 146 is formed of foil formed into walls 148 extending vertically to the plane of the illustration and arranged in an hexagonal pattern within the plane. Crushed honeycomb loses the regular structure but is both porous and mechanically stiff and can be easily shaped into a desired shield shape. The expanded metal mesh and the honeycomb have the advantages of long vertical sidewalls, which better confine the sputtered particles.

Other types of meshes may be used which provide similar advantages as the meshes described above. These various types of mesh offer the advantage that they can be more easily formed into complex shapes that is a solid material.

The many rough edges and small extent of planar surfaces of a mesh provide greater adhesion for the sputter coated material. Accordingly, a greater thickness of sputter coating can accumulate on the mesh shield before flaking rises to an unacceptable level. A multi-level mesh shield has the further advantage of an increased surface area over a solid shield. As a result, the shield fabricated according to the invention is designed for longer lifetime before it needs to be replaced. With proper design, the mesh should last as long as the target so both may be replaced in the same cycle of preventative maintenance.

Although it is possible to clean the mesh shield after it has accumulated an undue thickness of sputter coating, the mesh shield is less expensive than an arc-sprayed shield and may be considered a consumable to be discarded after a single cycle.

What is claimed is:

1. A sputter shield configured to protect walls of a sputter reactor from sputter deposition and to be removably fixed to said sputter reactor comprising a plurality of meshes laminated together, each of said plurality of meshes having a porosity factor of between 10% and 95%.

2. The shield of claim 1, further comprising a foil interposed between two of said meshes.

3. The shield of claim 2, wherein at least one aperture is formed through said plurality of meshes and through said foil.

4. The shield of claim 2, wherein at least one aperture is formed through said foil but not through said plurality of meshes.

5. The shield of claim 1, wherein a hole is cut through said plurality of laminated meshes.

6. The shield of claim 5, wherein edges of said hole are covered by a metal member.

7. The shield of claim 1, wherein said meshes comprise woven meshes of interlaced wires.

8. The shield of claim 1, wherein said laminated meshes are shaped to have axially arranged parts of a plurality of respective different diameters.

9. A sputter shield configured to protect walls of a sputter reactor from sputter deposition and to be removably fixed to said sputter reactor, comprising a mesh formed with a two-dimensional array of apertures therethrough and comprising an expanded metal mesh.

10. The shield of claim 9, wherein said mesh has a porosity factor of between 10% and 95%.

11. A sputter shield configured to protect walls of a sputter reactor from sputter deposition and to be removably fixed to said sputter reactor, comprising a mesh comprising crushed honeycomb.

12. A sputter shield configured to protect walls of a sputter reactor from sputter deposition and to be removably fixed to said sputter reactor, comprising:

a mesh having a porosity factor of between 10% and 95%: and a metal flange fixed to said mesh for supporting said shield on a processing chamber.

13. A plasma sputter reactor, comprising:

a vacuum chamber having sidewalls about a central axis of said chamber;

a pedestal configured to support a substrate to be sputter coated;

a target in opposition to said pedestal in opposition to said target; and a shield arranged about said central axis in an area between said target and said pedestal and comprising a plurality of layers of mesh laminated together.

14. The reactor of claim 13, wherein said shield is electrically grounded to said sidewalls.

15. The reactor of claim 13, wherein said shield includes:

a flange supported on said sidewalls;

a generally cylindrical portion extending from said flange to a position on a side of said pedestal opposite said target and comprising said plurality of layers of mesh; and a cup-shaped portion extending from said cylindrical portion toward said pedestal and along a side of said pedestal toward said target.

16. The reactor of claim 15, wherein said flange is a solid metal member fixed to said layers of mesh.

\* \* \* \* \*